(12) United States Patent
Heo et al.

(10) Patent No.: US 12,527,038 B2
(45) Date of Patent: Jan. 13, 2026

(54) ELECTRONIC DEVICE INCLUDING FERROELECTRIC THIN FILM STRUCTURE

(71) Applicant: Samsung Electronics Co., Ltd., Suwon-si (KR)

(72) Inventors: Jinseong Heo, Seoul (KR); Yunseong Lee, Osan-si (KR); Hyangsook Lee, Suwon-si (KR); Sanghyun Jo, Seoul (KR); Seunggeol Nam, Suwon-si (KR); Taehwan Moon, Suwon-si (KR); Hagyoul Bae, Hanam-si (KR); Eunha Lee, Seoul (KR); Junho Lee, Seongnam-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 648 days.

(21) Appl. No.: 17/894,504

(22) Filed: Aug. 24, 2022

(65) Prior Publication Data
US 2023/0062878 A1  Mar. 2, 2023

(30) Foreign Application Priority Data

Aug. 25, 2021 (KR) .......... 10-2021-0112473
Aug. 24, 2022 (KR) .......... 10-2022-0106061

(51) Int. Cl.
*H10D 30/69* (2025.01)
*H10D 64/68* (2025.01)

(52) U.S. Cl.
CPC ......... *H10D 30/701* (2025.01); *H10D 64/689* (2025.01)

(58) Field of Classification Search
None
See application file for complete search history.

(56) References Cited

U.S. PATENT DOCUMENTS 10,998,408 B2  5/2021 Yamaguchi
2006/0046380 A1* 3/2006 Choi .......... H10B 12/033
                                       438/238
(Continued)

FOREIGN PATENT DOCUMENTS

KR       10-0682934 B1   2/2007
KR  10-2019-0109606 A    9/2019
(Continued)

OTHER PUBLICATIONS

Extended European Search Report dated Jan. 16, 2023 issued in European Patent Application No. 22191955.8-1212.

*Primary Examiner* — Xiaoming Liu
(74) *Attorney, Agent, or Firm* — Harness, Dickey & Pierce, P.L.C.

(57) ABSTRACT

An electronic device includes: a substrate including a source, a drain, and a channel between the source and the drain; a gate electrode arranged above the substrate and facing the channel, the gate electrode being apart from the channel in a first direction; and a ferroelectric thin film structure between the channel and the gate electrode, the ferroelectric thin film structure including a first ferroelectric layer, a crystallization barrier layer including a dielectric material, and a second ferroelectric layer, which are sequentially arranged from the channel in the first direction. The average of sizes of crystal grains of the first ferroelectric layer may be less than or equal to the average of sizes of crystal grains of the second ferroelectric layer, and owing to small crystal grains, dispersion of performance may be improved.

20 Claims, 18 Drawing Sheets

(56) References Cited

U.S. PATENT DOCUMENTS

| | | | |
|---|---|---|---|
| 2006/0263910 A1 | 11/2006 | Hong et al. | |
| 2011/0110015 A1 | 5/2011 | Zhang et al. | |
| 2018/0166453 A1* | 6/2018 | Müller | H10D 1/692 |
| 2019/0244973 A1* | 8/2019 | Yoo | H01L 21/02304 |
| 2020/0203499 A1* | 6/2020 | Chang | H10D 30/699 |
| 2021/0028180 A1 | 1/2021 | Yamaguchi | |
| 2021/0083121 A1* | 3/2021 | Heo | H10D 30/751 |
| 2021/0193811 A1* | 6/2021 | Moon | H01L 21/02356 |
| 2022/0140148 A1 | 5/2022 | Nam et al. | |
| 2023/0120089 A1* | 4/2023 | Yoon | H10D 30/701 |
| | | | 257/295 |

FOREIGN PATENT DOCUMENTS

| | | |
|---|---|---|
| KR | 10-2021-0033346 A | 3/2021 |
| KR | 10-2022-0060458 A | 5/2022 |

* cited by examiner

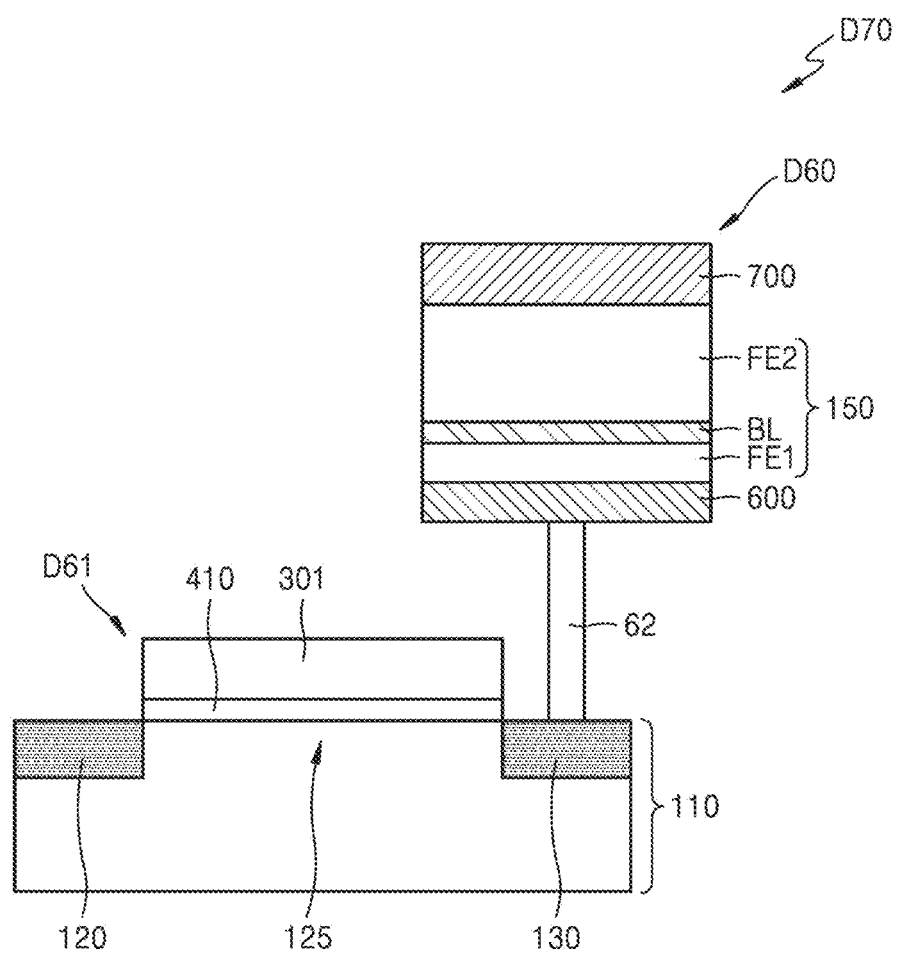
FI7. 17

ELECTRONIC DEVICE INCLUDING FERROELECTRIC THIN FILM STRUCTURE

CROSS-REFERENCE TO RELATED APPLICATION

This application is based on and claims priority under 35 U.S.C. § 119 to Korean Patent Applications No. 10-2021-0112473, filed on Aug. 25, 2021, and No. 10-2022-0106061, filed on Aug. 24, 2022, in the Korean Intellectual Property Office, the disclosure of which is incorporated by reference herein in its entirety.

BACKGROUND

Some example embodiments relate to ferroelectric thin film structures and/or electronic devices including the ferroelectric thin film structures.

Ferroelectrics are materials having ferroelectricity and thus spontaneous polarization is maintained therein as electric dipole moments are aligned without an external electric field applied thereto. Even when a voltage applied to ferroelectrics is reduced to 0 V, polarization (and/or an electric field) remains semi-permanently in the ferroelectrics. Research has been conducted on applying ferroelectric materials to logic devices or memory devices.

Along with the recent down-scaling trend in electronic apparatuses, electronic devices provided in electronic apparatuses have also been downscaled. As the size of electronic devices decreases, dispersion of the distribution of number of ferroelectric crystal grains of the ferroelectrics provided in the electronic devices increases, which may result in non-uniform characteristics.

SUMMARY

Provided are electronic devices having a small size and/or high performance.

Additional aspects will be set forth in part in the description which follows and, in part, will be apparent from the description, or may be learned by practice of various example embodiments.

According to some example embodiments, an electronic device includes: a substrate including a source, a drain, and a channel between the source and the drain; a gate electrode above the substrate and facing the channel, the gate electrode being apart from the channel in a first direction; and a ferroelectric thin film structure between the channel and the gate electrode. The ferroelectric thin film structure includes a first ferroelectric layer, a crystallization barrier layer including a dielectric material, and a second ferroelectric layer. The first ferroelectric layer, the crystallization barrier layer, and the second ferroelectric layer are sequentially arranged from the channel in the first direction. An average of sizes of crystal grains of the first ferroelectric layer is less than or equal to an average of sizes of crystal grains of the second ferroelectric layer. The size of each crystal grain may refer to a width, such as a maximum width, of the crystal grain in a cross-section taken perpendicular to the first direction.

The average of the sizes of the crystal grains of the first ferroelectric layer may be about 20 nm or less.

The average of the sizes of the crystal grains of the first ferroelectric layer may be about 10 nm or less.

A thickness of the first ferroelectric layer may range from about 0.5 nm to about 2 nm.

A thickness of the first ferroelectric layer may be less than or equal to a thickness of the second ferroelectric layer.

A thickness of the crystallization barrier layer may be greater than 0 nm and less than or equal to about 2 nm.

The crystallization barrier layer may include at least one selected from the group consisting of or including $AlO_x$ (0<x<1), $LaO_x$ (0<x<1), $YO_x$ (0<x<1), $LaAlO_x$ (0<x<1), $TaO_x$ (0<x<1), $TiO_x$ (0<x<1), $SrTiO_x$ (0<x<1), MgO, ZrSiO, a nitride, an oxynitride, graphene, boron nitride (BN), and a two-dimensional (2D) dielectric material.

The electronic device may further include a dielectric layer between the channel and the first ferroelectric layer.

The dielectric layer may include a dielectric material having a bandgap larger than a bandgap of the first ferroelectric layer.

The ferroelectric thin film structure further may include: a second crystallization barrier layer on the second ferroelectric layer; and a third ferroelectric layer on the second crystallization barrier layer.

A thickness t1 of the first ferroelectric layer, a thickness t2 of the second ferroelectric layer, and a thickness t3 of the third ferroelectric layer may satisfy t1≤t2≤t3 (e.g., t1 is less than or equal to t2, and t2 is less than or equal to t3).

The average (a1) of the sizes of the crystal grains of the first ferroelectric layer, the average (a2) of the sizes of the crystal grains of the second ferroelectric layer, and an average (a3) of sizes of crystal grains of the third ferroelectric layer may satisfy a1≤a2≤a3 (e.g., a1 is less than or equal to a2, and a2 is less than or equal to a3).

A total thickness of the ferroelectric thin film structure may range from about 4 nm to about 15 nm.

The electronic device may have multi-bit memory performance.

A length of the channel in a direction from the source to the drain may be about 1000 nm or less.

The channel may include at least one selected from the group consisting of or including Si, Ge, SiGe, Group III-V semiconductors, oxide semiconductors, nitride semiconductors, oxynitride semiconductors, 2D materials, quantum dots, transition metal dichalcogenides, and organic semiconductors.

The first ferroelectric layer and the second ferroelectric layer may each independently include an oxide of Si, Al, Hf, or Zr.

The first ferroelectric layer and the second ferroelectric layer may each independently include the oxide as a base material, and the first ferroelectric layer and the second ferroelectric layer may each independently further include one or more of C, Si, Ge, Sn, Pb, Al, Y, La, Gd, Mg, Ca, Sr, Ba, Ti, Zr, Hf, or N as a dopant material.

The first ferroelectric layer and the second ferroelectric layer may include the same oxide as a base material, and the first ferroelectric layer and the second ferroelectric layer may further include different dopant materials.

According to some example embodiments, an electronic apparatus includes: a memory device; and a controller/control unit/control device electrically connected to the memory device and configured to control the memory device. At least one of the memory device and the controller includes the electronic device.

According to some example embodiments, a semiconductor device may comprise a first electrode; a second electrode; and a ferroelectric thin film structure between the first electrode and the second electrode, the ferroelectric thin film structure comprising a first ferroelectric layer, a crystallization barrier layer comprising a dielectric material, and a second ferroelectric layer. The first ferroelectric layer, the crystallization barrier layer, and the second ferroelectric layer are sequentially on the first electrode in the first direction. An average of sizes of crystal grains of the first ferroelectric layer is less than or equal to an average of sizes of crystal grains of the second ferroelectric layer. A size of each crystal grain refers to a maximum width of the crystal grain in a cross-section intersecting the first direction.

The semiconductor device may further include a transistor; and a contact connected to the transistor and the first electrode.

The average of the sizes of the crystal grains of the first ferroelectric layer is about 20 nm or less.

The crystallization barrier layer comprises at least one selected from the group consisting of or including $AlO_x$ (0<x<1), $LaO_x$ (0<x<1), $YO_x$ (0<x<1), $LaAlO_x$ (0<x<1), $TaO_x$ (0<x<1), $TiO_x$ (0<x<1), $SrTiO_x$ (0<x<1), MgO, ZrSiO, a nitride, an oxynitride, graphene, boron nitride (BN), and a two-dimensional (2D) dielectric material.

BRIEF DESCRIPTION OF THE DRAWINGS

The above and other aspects, features, and/or advantages of certain embodiments of the disclosure will be more apparent from the following description taken in conjunction with the accompanying drawings, in which:

FIG. 17 is a cross-sectional view illustrating a schematic structure of an electronic device according to some example embodiments.

DETAILED DESCRIPTION OF SOME EXAMPLE EMBODIMENTS

Figure 1:
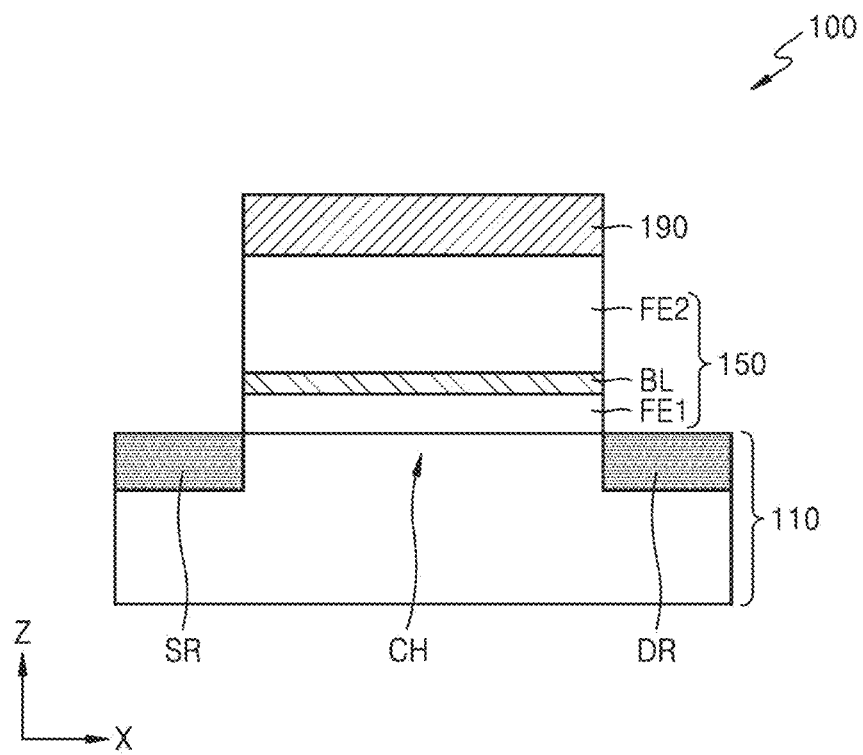
FIG. 1 is a cross-sectional view illustrating a schematic structure of an electronic device according to some example embodiments.

Reference will now be made in detail to various embodiments, examples of which are illustrated in the accompanying drawings, wherein like reference numerals refer to like elements throughout. In this regard, the present embodiments may have different forms and should not be construed as being limited to the descriptions set forth herein. Accordingly, example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, various example embodiments will be described with reference to the accompanying drawings. Various embodiments described herein are for illustrative purposes only, and various modifications may be made therein. In the drawings, like reference numerals refer to like elements, and the sizes of elements may be exaggerated for clarity of illustration.

In the following description, when an element is referred to as being "above" or "on" another element, the element may be directly on the other element while making contact with the other element or may be above the other element without making contact with the other element.

Although the terms "first" and "second" are used to describe various elements, these terms are only used to distinguish one element from another element. These terms do not limit elements to having different materials or structures.

The terms of a singular form may include plural forms unless otherwise mentioned. It will be further understood that the terms "comprises" and/or "comprising" used herein specify the presence of stated features or elements, but do not preclude the presence or addition of one or more other features or elements.

As used herein, terms such as "unit" or "module" or "device" or "controller" may be used to denote a unit that has at least one function or operation and is implemented with hardware, software, or a combination of hardware and software.

An element referred to with the definite article or a demonstrative pronoun may be construed as the element or the elements even though it has a singular form.

Operations of a method may be performed in appropriate order unless explicitly described in terms of order or described to the contrary. In addition, examples, or exemplary terms (for example, "such as" and "etc.") are used for the purpose of description and are not intended to limit the scope of the inventive concept unless defined by the claims.

FIG. 1 is a cross-sectional view illustrating a schematic structure of an electronic device 100 according to some example embodiments.

The electronic device 100 may include: a substrate 110 having a channel CH; a gate electrode 190 which is apart from the substrate 110; and a ferroelectric thin film structure 150 which is arranged between the substrate 110 and the gate electrode 190.

The substrate 110 may include a semiconductor material. For example, the substrate 110 may include silicon (Si), germanium (Ge), silicon germanium (SiGe), a Group III-V semiconductor, silicon carbide (SiC), gallium arsenide (GaAs), indium arsenide (InAs), indium phosphide (InP), or the like. The substrate 100 may be a single-crystal substrate, or may be a polycrystalline substrate. The substrate 100 may be doped, e.g., may be lightly doped; however, example embodiments are not limited thereto.

The substrate 110 may include a source SR and a drain DR, and the channel CH electrically connected to the source SR and the drain DR. For example, the source SR may be electrically connected to and/or in contact with an end of the channel CH, and the drain DR may be electrically connected to and/or in contact with another end of the channel CH. For example, the channel CH may be defined as a region between the source SR and the drain DR in the substrate 110.

The source SR, the drain DR, and the channel CH may be independently formed by implanting/incorporating dopants into different regions of the substrate 110, and in this case, the source SR, the channel CH, and the drain DR may include a material of the substrate 110 as a base material. In addition, the source SR and the drain DR may include a conductive material, and for example, the source SR and the drain DR may each independently include at least one of a metal, a metal compound, or a conductive polymer.

The source SR and the drain DR may include a silicide portion; however, example embodiments are not limited thereto. The source SR and the drain DR may include impurities such as at least one of boron, phosphorus, or arsenic; however, example embodiments are not limited thereto. The channel region CH may include impurities that may be an opposite conductivity than the impurities included in either or both of the source region SR and the drain region DR; however, example embodiments are not limited thereto.

The gate electrode 190 may be arranged above and apart from the substrate 110 and may face the channel CH.

The gate electrode 190 may have a conductivity of about 1 Mohm/square or less. The gate electrode 190 may include at least one selected from the group consisting of or including a metal, a metal nitride, a metal carbide, and polysilicon such as doped polysilicon. For example, the metal may include one or more of aluminum (Al), tungsten (W), molybdenum (Mo), titanium (Ti), or tantalum (Ta); the metal nitride may include titanium nitride (TiN) and/or tantalum nitride (TaN); and the metal carbide may be a metal carbide doped with (or containing) aluminum or silicon, and examples thereof may include one or more of TiAlC, TaAlC, TiSiC and TaSiC. The gate electrode 190 may have a structure in which a plurality of materials are stacked. For example, the gate electrode 190 may have a stacked structure of metal nitride layer/metal layer such as TiN/Al, or a stacked structure of metal nitride layer/metal carbide layer/metal layer such as TiN/TiAlC/W. The gate electrode 190 may include a titanium nitride layer (TiN) and/or molybdenum (Mo), and various modifications of the above examples may be used for the gate electrode 190.

The ferroelectric thin film structure 150 may be arranged between the substrate 110 and the gate electrode 190. For example, the ferroelectric thin film structure 150 may be formed on the channel CH, and may form a gate stack together with the gate electrode 190.

The ferroelectric thin film structure 150 may include a first ferroelectric layer FE1, a crystallization barrier layer BL, and a second ferroelectric layer FE2, which are sequentially arranged in a direction from the channel CH toward the gate electrode 190. The first ferroelectric layer FE1 and the second ferroelectric layer FE2 each independently include a ferroelectric. Ferroelectrics are materials having ferroelectricity, in which spontaneous polarization is maintained as electric dipole moments are aligned without an external electric field applied thereto.

The ferroelectric included in the ferroelectric thin film structure 150 may have negative capacitance in a certain operation range, and thus, when the ferroelectric is applied to the gate stack, a low sub-threshold swing value SS may be obtained.

The ferroelectric included in the first ferroelectric layer FE1 and the second ferroelectric layer FE2 may include an oxide of one or more of silicon (Si), aluminum (Al), hafnium (Hf), or zirconium (Zr). The ferroelectric may include one or more materials selected from the group consisting of or including hafnium oxide ($HfO_2$), zirconium oxide ($ZrO_2$), and hafnium-zirconium oxide ($Hf_xZr_{1-x}O_2$, where $0<x<1$). These metal oxides may have ferroelectricity even in the form of very thin films having a several nanometer (nm) thickness, and may be applied to existing silicon-based semiconductor device processes to obtain high mass productivity.

The ferroelectric may include at least one of the above-mentioned oxides as a base material, and may further include one or more of C, Si, Ge, Sn, Pb, Al, Y, La, Gd, Mg, Ca, Sr, Ba, Ti, Zr, Hf, or N as a dopant material. The content of dopant material based on the metal element of the base material may be greater than 0 at %, 0.2 at % or more, 0.5 at % or more, 1 at % or more, 2 at % or more, 3 at % or more, 10 at % or less, 8 at % or less, 7 at % or less, or 6 at % or less. However, this is merely a non-limiting example.

The first ferroelectric layer FE1 and the second ferroelectric layer FE2 may include the same oxide as a base material, and may further include the same or different dopant materials. However, this is merely an example, and in other examples, the first ferroelectric layer FE1 and the second ferroelectric layer FE2 may include different oxides as base materials, or may be of or may include the same ferroelectric.

The ferroelectric included in the first ferroelectric layer FE1 and the second ferroelectric layer FE2 may include an orthorhombic crystal phase. For example, the ferroelectric may include several crystalline phases such as an orthorhombic crystal phase and/or a tetragonal crystal phase, and in this case, the ferroelectric may include the orthorhombic crystalline phase as a dominant phase or in a largest amount.

Ferroelectrics may be distinguished from high-k dielectrics according to the presence/size of residual polarization, the composition of a metal oxide, the type and content of a dopant, crystal phases, and the like. The type and content of each element of ferroelectrics may be measured by methods various methods such as methods using one or more of X-ray photoelectron spectroscopy (XPS), Auger electron spectroscopy (AES), and inductively coupled plasma (ICP). Alternatively or additionally, the distribution of crystal phases may be observed by various methods such as transmission electron microscopy (TEM) and/or grazing incidence X-ray diffraction (GIXRD).

The ferroelectric thin film structure 150 may have a length corresponding to the length of the channel CH (e.g. a gate length). The ferroelectric thin film structure 150 may have a length equal to or similar to the length of the channel CH.

The length of the channel CH refers to the length of the channel CH in a direction (X direction) from the source SR toward the drain DR, and may be used as a reference defining the size of the electronic device 100. According to trends toward downscaling of electronic apparatuses, the electronic device 100 to be provided in such an electronic apparatus is also required to or desired to have a small size, and thus the length of the channel CH may be, for example, about 1000 nm or less, about 200 nm or less, about 100 nm or less, or about 50 nm or less. The length of the channel CH may be several nanometers (nm) or more. Therefore, the length of each of the first ferroelectric layer FE1 and the second ferroelectric layer FE2 included in the ferroelectric thin film structure 150 may be about 200 nm or less, about 100 nm or less, or about 50 nm or less, or several nanometers (nm) or more.

The ferroelectric thin film structure 150 of the embodiment is configured to have desired performance with a small size.

The crystallization barrier layer BL arranged between the first ferroelectric layer FE1 and the second ferroelectric layer FE2 may limit the size of crystal grains of the first ferroelectric layer FE1. The crystallization barrier layer BL may include a dielectric material. The crystallization barrier layer BL may include at least one selected from the group consisting of or including $AlO_x$ (0<x<1), $LaO_x$ (0<x<1), $YO_x$ (0<x<1), $LaAlO_x$ (0<x<1), $TaO_x$ (0<x<1), $TiO_x$ (0<x<1), $SrTiO_x$ (0<x<1), MgO, ZrSiO, a nitride, an oxynitride, graphene, boron nitride (BN), and a two-dimensional (2D) dielectric material.

The thickness of the crystallization barrier layer BL may be greater than 0 nm and less than or equal to about 2 nm, about 1 nm, about 0.8 nm, about 0.5 nm, or about 0.2 nm.

The total thickness of the ferroelectric thin film structure 150 may be greater than 0 nm and may be less than or equal to about 20 nm. The total thickness of the ferroelectric thin film structure 150 may be determined according to specifications required for or associated with a memory window. For example, to obtain a memory window of about 1V, the total thickness of the ferroelectric thin film structure 150 may be within the range of about 4 nm to about 15 nm or within the range of about 8 nm to about 12 nm. The thicknesses described above may be measured by various methods such as a method using an ellipsometer (such as, for example, SE MG-1000, Nano View); however, example embodiments are not limited thereto.

The first ferroelectric layer FE1 and the second ferroelectric layer FE2 have crystal grains, the sizes of which are limited by or associated with the crystallization barrier layer BL arranged between the first ferroelectric layer FE1 and the second ferroelectric layer FE2. The average size of the crystal grains of the first ferroelectric layer FE1 may be less than or equal to the average size of the crystal grains of the second ferroelectric layer FE2. Here, the "size" of a crystal grain refers to the maximum width of the crystal grain in a cross-section of the crystal grain, which is taken intersecting with, e.g. perpendicular to, a first direction (Z direction) in which the first ferroelectric layer FE1, the crystallization barrier layer BL, and the second ferroelectric layer FE2 are sequentially arranged.

The average size of the crystal grains of the first ferroelectric layer FE1 may be about 20 nm or less, about 10 nm or less, or about 5 nm or less.

The thickness of the first ferroelectric layer FE1 may be less than or equal to the thickness of the second ferroelectric layer FE2. The thickness of the first ferroelectric layer FE1 may be about 2 nm or less, about 1.8 nm or less, and/or about 0.5 nm or more or about 0.5 nm or less, or within a range from about 0.5 nm to about 2 nm.

The thickness of the first ferroelectric layer FE1 is set such that the first ferroelectric layer FE1 may have small crystal grains. When the length of the first ferroelectric layer FE1 is reduced, but the size of the crystal grains of the first ferroelectric layer FE1 is not accordingly reduced, the distribution of electric dipole domains formed in the first ferroelectric layer FE1 may not be uniform. Alternatively or additionally, such a distribution pattern may indicate dispersion in manufacturing processes and may cause dispersion in performance. For example, due to such a (wide) distribution pattern, devices manufactured in the same manufacturing processes may have different performance characteristics such as different electrical performance characteristics. In contrast, when the size of the crystal grains of the first ferroelectric layer FE1 is reduced according to the length of the first ferroelectric layer FE1, the distribution of electric dipole domains of the first ferroelectric layer FE1 may be more relatively uniform, and dispersion in performance may be reduced.

Figure 2A:
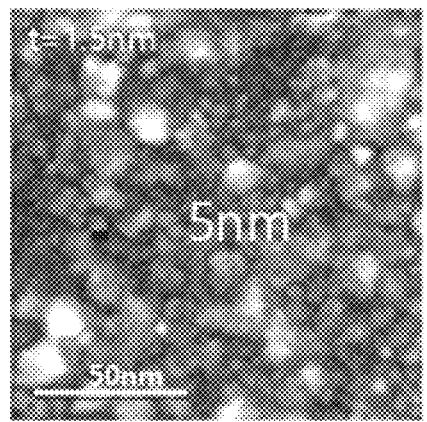
FIGS. 2A and 2B are micrographs illustrating the size of crystal grains according to the thickness of a ferroelectric layer.
Figure 2B:
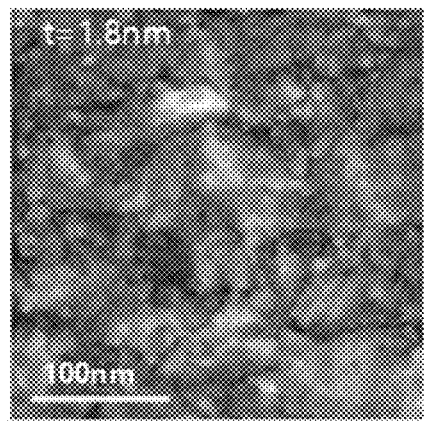

FIGS. 2A and 2B are electron micrographs illustrating the size of crystal grains according to the thickness of a ferroelectric layer, which may be employed in the ferroelectric thin film structure 150 shown in FIG. 1.

FIG. 2A shows a case in which the thickness of the ferroelectric layer was 1.5 nm, and the size of the crystal grains was observed to be about 5 nm.

FIG. 2B shows a case in which the thickness of the ferroelectric layer was 1.8 nm, and the size of the crystal grains was observed to be about 10 nm to several tens of nanometers (nm).

As described above, it will be understood that the size of crystal grains of a ferroelectric layer is closely related to the thickness of the ferroelectric layer, and small crystal grains may be formed in a ferroelectric layer by limiting the thickness of the ferroelectric layer.

Figure 3:
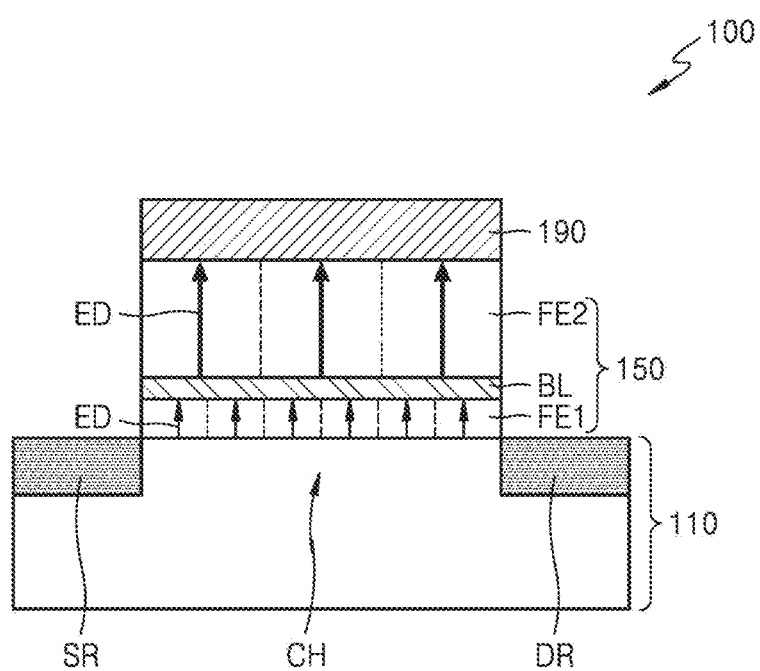
FIG. 3 is a conceptual view illustrating an example of an electric dipole domain distribution in a ferroelectric thin film structure of the electronic device shown in FIG. 1.

FIG. 3 is a conceptual view illustrating an example of an electric dipole domain distribution in the ferroelectric thin film structure 150 of the electronic device 100 shown in FIG. 1.

The first ferroelectric layer FE1, the crystallization barrier layer BL, and the second ferroelectric layer FE2 are arranged within the set total thickness of the ferroelectric thin film structure 150, and the size of crystal grains are substantially uniform. Thus, the distribution of electric dipole domains, ED, is also substantially uniform.

Figure 4:
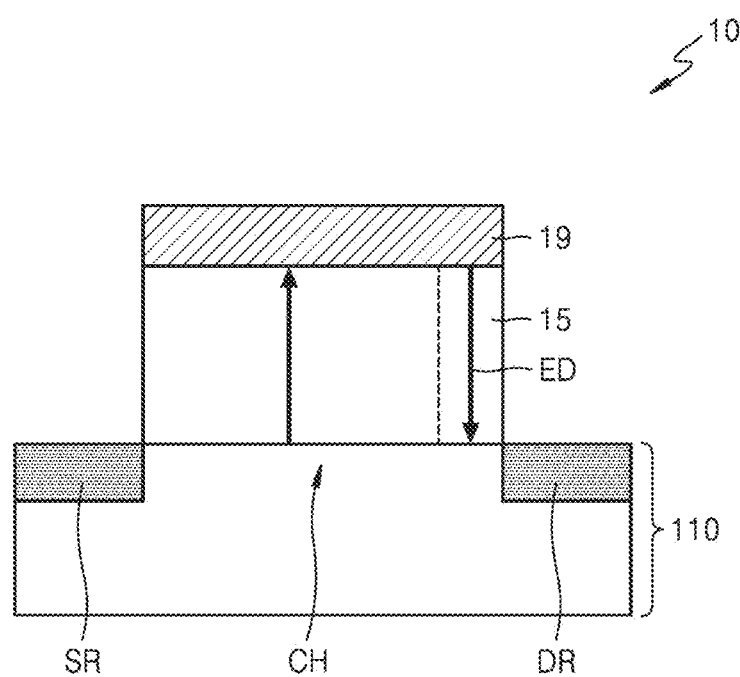
FIG. 4 is a conceptual view illustrating an example of an electric dipole domain distribution in a ferroelectric layer of an electronic device according to a comparative example.

FIG. 4 is a conceptual view illustrating an example of an electric dipole domain distribution in a ferroelectric layer 15 of an electronic device 10 according to a comparative example.

The electronic device 10 of the comparative example includes: a substrate 110 having a source SR, a drain DR, and a channel CH; the ferroelectric layer 15; and a gate electrode 19. The electronic device 10 is different from the electronic device 100 of example embodiments in that the electronic device 10 includes a single layer of a ferroelectric, that is, the ferroelectric layer 15. The ferroelectric layer 15 provides a thickness, which is set according to memory requirements or desires, by a single layer of a ferroelectric, and thus the size of crystal grains of the ferroelectric may be large, for example, several tens of nanometers (nm) or more. Therefore, due to the large crystal grains, the distribution of electric dipole domains ED in the ferroelectric layer 15 is not uniform or is less uniform within the limited length of the ferroelectric layer 15 as shown in FIG. 4. Alternatively or additionally, one or more of the number, size, or the like of electric dipole domains of other electronic devices, which are manufactured together with the electronic device 10, may be different from that of the electronic device 10.

The electronic device 100 of various example embodiments may have the performance of memory devices and the performance of multi-bit memory devices (e.g. of multilevel cell devices) as well.

Figure 5:
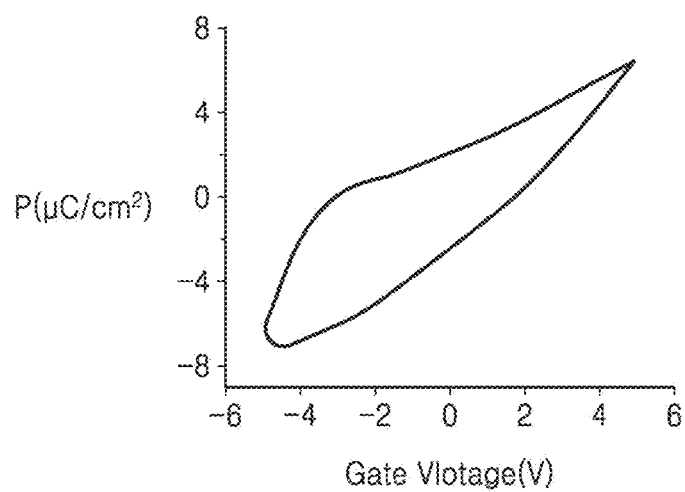
FIG. 5 is a graph illustrating a polarization hysteresis measured in the ferroelectric thin film structure of the electronic device shown in FIG. 1.

FIG. 5 is a graph illustrating a polarization hysteresis measured in the ferroelectric thin film structure 150 of the electronic device 100 shown in FIG. 1

FIG. 5 shows that even when the crystallization barrier layer BL is arranged in the middle of the ferroelectric of the ferroelectric thin film structure 150, the ferroelectric thin film structure 150 may exhibit a polarization hysteresis with respect to a gate voltage and may thus be used in a memory device.

Figure 6:
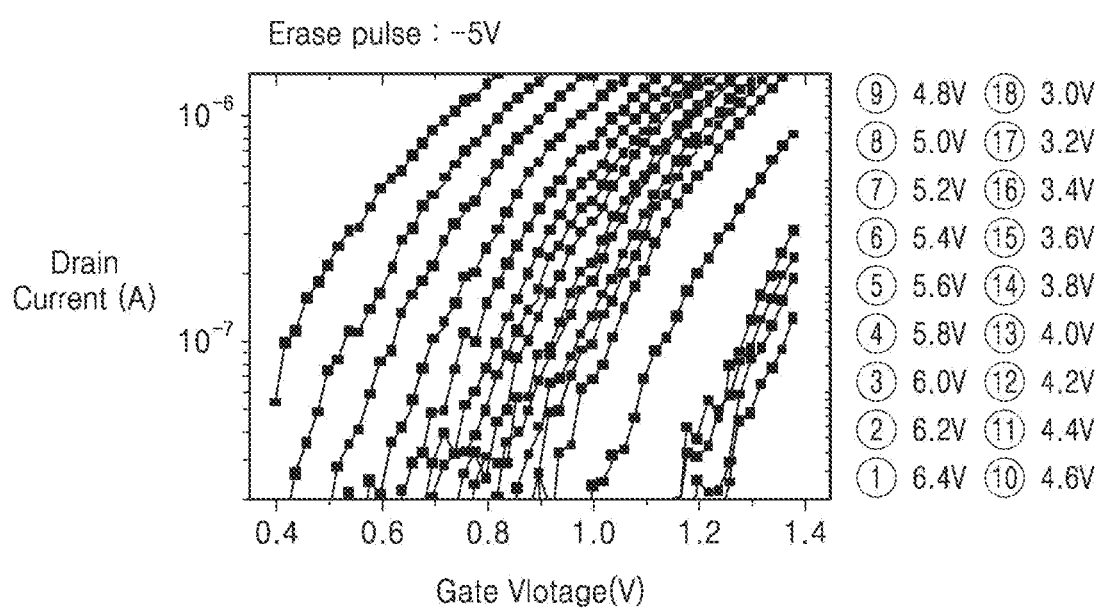
FIG. 6 is a graph conceptually illustrating multi-bit performance that the electronic device shown in FIG. 1 may have.

FIG. 6 is a graph conceptually illustrating multi-bit performance that the electronic device 100 shown in FIG. 1 may have.

Ferroelectrics may refer to materials in which polarization remains semi-permanently even when a voltage applied thereto is reduced to 0 V. Such residual polarization of a ferroelectric may be expressed by the vector sum of a plurality of electric dipoles in the ferroelectric, and the polarity (direction) and magnitude of the residual polarization may depend on an external voltage applied to the ferroelectric. Memory devices having non-volatile characteristics may be provided by using the above-described characteristics. Such a memory device may have residual polarization values corresponding to programming and erasing. Multi-bit performance, or multilevel cell performance, means that there are multiple states corresponding to programming. Depending on the polarization direction of the ferroelectric, there may be a conductance difference between a source and a drain, and owing to this, information corresponding to a programmed state may be written or read.

The graph shown in FIG. 6 conceptually shows multi-bit performance of an example device having a long channel length (e.g. a long length between a source S and a drain D) and a plurality of electric dipole domains, the multi-bit performance realizing various programmed states. The graph shows a relationship between drain current and gate voltage for various source-drain voltages. The source-drain voltages respectively corresponding to the curves in the graph are denoted with ①, ②, . . . , etc. in the left-to-right order of the curves. Erase voltage (erase pulse) was −5 V, and the graph shows that various programmed states are expressible.

The ferroelectric thin film structure 150 of the electronic device 100 of various example embodiments has small crystal grains, the distribution of which is substantially uniform, and thus it is expected that although the semiconductor device 100 has a small channel length, the semiconductor device 100 may have multi-bit performance like the multi-bit performance shown in FIG. 6.

Figure 7:
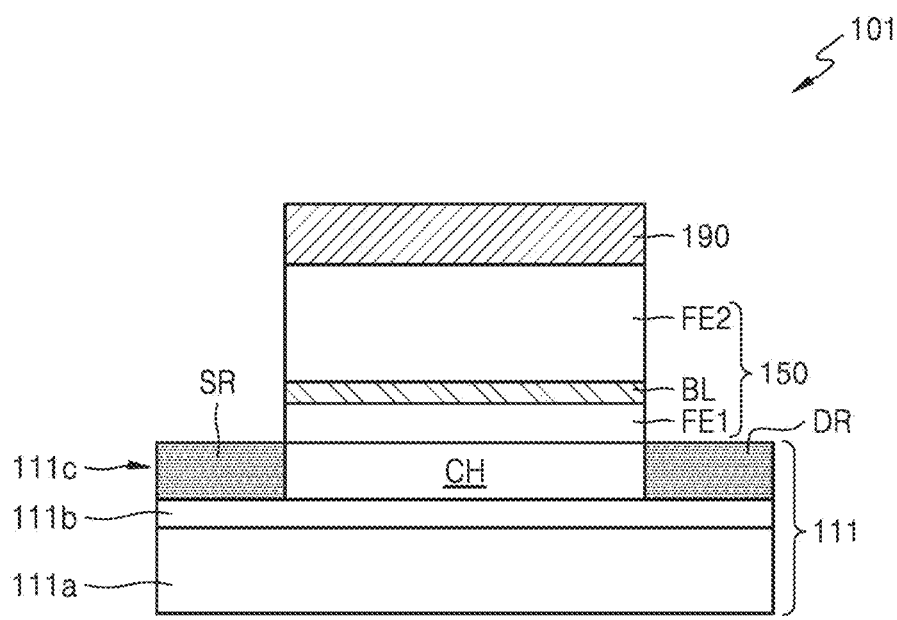
FIG. 7 is a cross-sectional view illustrating a schematic structure of an electronic device according to some example embodiments.

FIG. 7 is a cross-sectional view illustrating a schematic structure of an electronic device 101 according to various example embodiments.

The electronic device 101 shown in FIG. 7 is different from the electronic device 100 shown in FIG. 1 in that the electronic device 101 includes a substrate 111, which is a silicon on insulator (SOI) such as a silicon on oxide substrate. The substrate 111 may include a lower silicon layer 111a, a silicon oxide layer 111b, and an upper silicon layer 111c, and the upper silicon layer 111c may include a source SR, a drain DR, and a channel CH.

Figure 8:
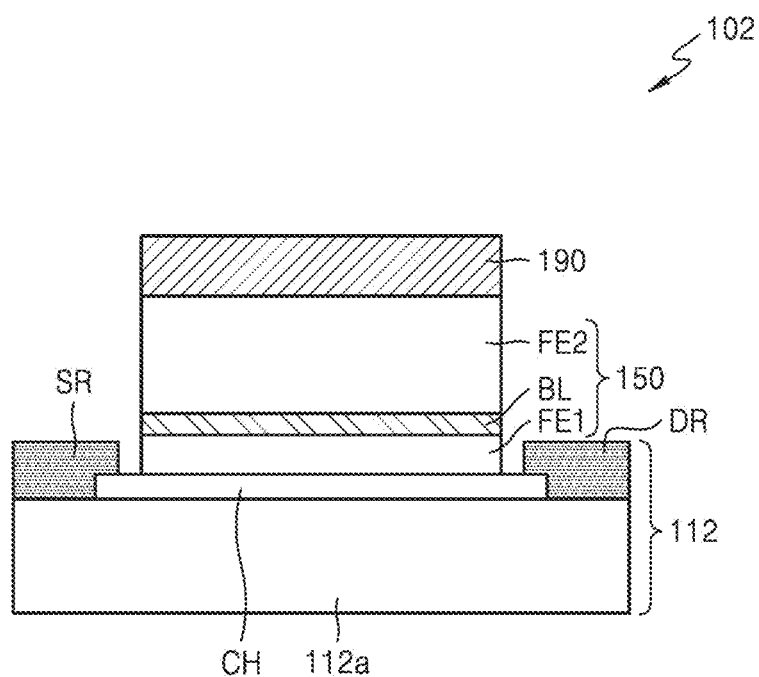
FIG. 8 is a cross-sectional view illustrating a schematic structure of an electronic device according to some example embodiments.

FIG. 8 is a cross-sectional view illustrating a schematic structure of an electronic device 102 according to various example embodiments.

The electronic device 102 of FIG. 8 is different from the electronic device 100 shown in FIG. 1 in that a material layer different from a support layer 112a is formed as a channel CH. For example, a substrate 112 includes: the support layer 112a; and the channel CH, a source SR, and a drain DR, which are formed on the support layer 112a. The channel CH may be formed separately from the support layer 112a, instead of being based on a material of the support layer 112a. In addition, the source SR and/or the drain DR may be implemented separately from the support layer 112a.

The material composition of the channel CH may vary. For example, the channel CH may include not only a semiconductor material such as Si, Ge, SiGe, or a Group III-V semiconductor material, but also at least one selected from the group consisting of or including an oxide semiconductor, a nitride semiconductor, an oxynitride semiconductor, a 2D material, quantum dots, and an organic semiconductor. For example, the oxide semiconductor may include InGaZnO or the like; the 2D material may include a transition metal dichalcogenide (TMD) or graphene; and the quantum dots may include colloidal quantum dots, nanocrystal structures, or the like. In addition, the source SR and the drain DR may include a conductive material, and for example, the source SR and the drain DR may each independently include a metal, a metal compound, or a conductive polymer.

In the following description, each electronic device is described as having a structure in which a source SR, a drain DR, and a channel CH are formed in a substrate 110 based on a material of the substrate 110 as described with reference to FIG. 1. However, the electronic devices are not limited thereto and may have substrates such as the substrates 111 and 112 shown in FIGS. 7 and 8.

Figure 9:
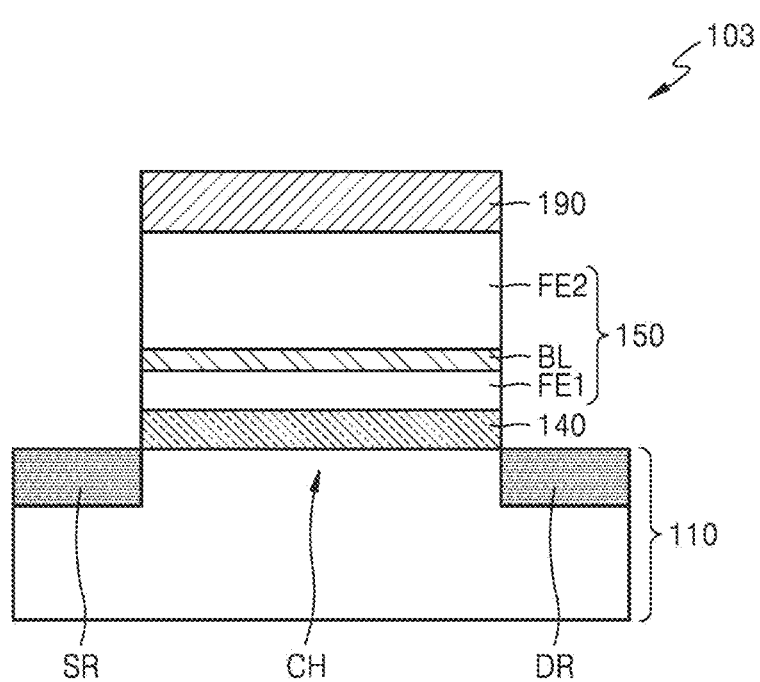
FIG. 9 is a cross-sectional view illustrating a schematic structure of an electronic device according to some example embodiments.

FIG. 9 is a cross-sectional view illustrating a schematic structure of an electronic device 103 according to various example embodiments.

The electronic device 103 of the embodiments in FIG. 9 is different from the electronic device 100 shown in FIG. 1 in that the electronic device 103 further includes a dielectric layer 140 between a channel CH and a first ferroelectric layer FE1.

The dielectric layer 140 may suppress or prevent or reduce the likelihood of and/or impact from electrical leakage. The dielectric layer 140 may include a dielectric material having a bandgap larger than the bandgap of the first ferroelectric layer FE1. The dielectric layer 140 may include a plurality of material layers having different dielectric constants. The dielectric layer 140 may include a paraelectric material and/or a high-k material. The dielectric layer 140 may include one or more of silicon oxide, silicon nitride, aluminum oxide, hafnium oxide, zirconium oxide, or the like, or may include a 2D insulator such as hexagonal boron nitride (h-BN). For example, the dielectric layer 140 may include silicon oxide ($SiO_2$), silicon nitride ($SiN_x$), hafnium oxide ($HfO_2$), hafnium silicon oxide ($HfSiO_4$), lanthanum oxide ($La_2O_3$), lanthanum aluminum oxide ($LaAlO_3$), zirconium oxide $ZrO_2$, hafnium zirconium oxide ($HfZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), lead scandium tantalum oxide ($PbSc_{0.5}Ta_{0.5}O_3$), lead zinc niobate ($PbZnNbO_3$), or the like. In addition, the dielectric layer 140 may include a metal oxynitride such as aluminum oxynitride (AlON), zirconium oxynitride (ZrON), hafnium oxynitride (HfON), lanthanum oxynitride (LaON), or yttrium oxynitride (YON); a silicate such as one or more of ZrSiON, HfSiON, YSiON, or LaSiON; or an aluminate such as ZrAlON and/or HfAlON. The dielectric layer 140 may form a gate stack together with a gate electrode 190.

Figure 10:
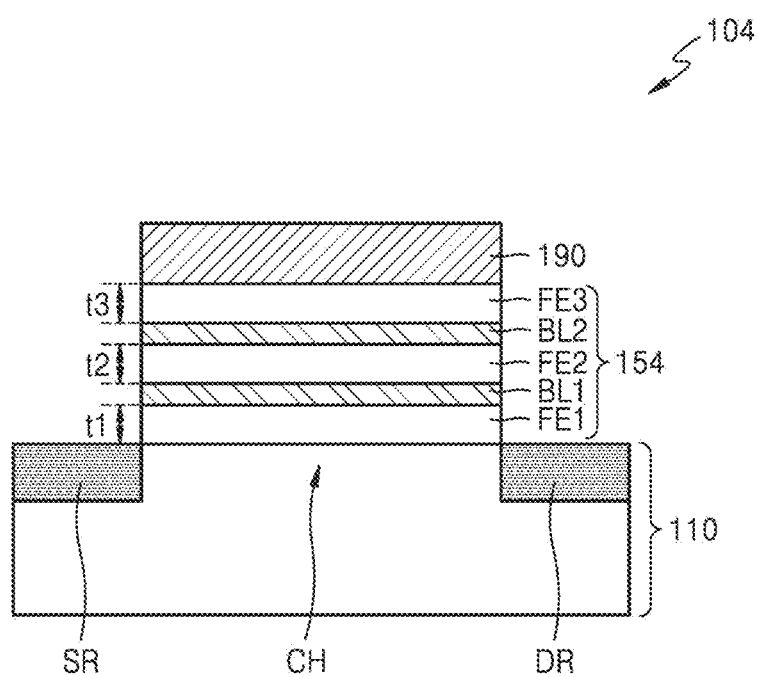
FIG. 10 is a cross-sectional view illustrating a schematic structure of an electronic device according to some example embodiments.

FIG. 10 is a cross-sectional view illustrating a schematic structure of an electronic device 104 according to some example embodiments.

The electronic device 104 of the embodiments according to FIG. 10 is different from the electronic device 100 shown in FIG. 1 in that a ferroelectric thin film structure 154 further includes a second crystallization barrier layer BL2 and a third ferroelectric layer FE3. The ferroelectric thin film structure 154 may include a first ferroelectric layer FE1, a first crystallization barrier layer BL1, and a second ferroelectric layer FE2, the second crystallization barrier layer BL2, and the third ferroelectric layer FE3, which are sequentially arranged in a direction from a channel CH toward a gate electrode 190.

The thickness t1 of the first ferroelectric layer FE1, the thickness t2 of the second ferroelectric layer FE2, and the thickness t3 of the third ferroelectric layer FE3 may satisfy a relationship: $t1 \leq t2 \leq t3$.

The average sizes of a1, a2, and a3 of crystal grains included in the first ferroelectric layer FE1, the second ferroelectric layer FE2, and the third ferroelectric layer FE3 may satisfy $a1 \leq a2 \leq a3$. Here, as described above with reference to FIG. 1, the "size" of a crystal grain refers to the maximum width of the crystal grain in a cross-section of the crystal grain, which is taken perpendicular to the thickness direction of the ferroelectric layer. a1, a2, and a3 may each be about 20 nm or less, about 10 nm or less, or about 5 nm or less.

As described above, the ferroelectric thin film structure 154 may include a plurality of crystallization barrier layers such as the first and second crystallization barrier layers BL1 and BL2 when it is difficult to uniformly form sufficiently small crystal grains in a ferroelectric according to thickness requirements by using only a single crystallization barrier layer as shown in FIG. 1.

The electronic device 104 of the present embodiment is an example in which the ferroelectric thin film structure 154 includes two crystallization barrier layers, that is, the first and second crystallization barrier layers BL1 and BL2. However, example embodiments are not limited thereto, and in various other embodiments, three or more crystallization barrier layers may be formed with ferroelectric layers therebetween.

The electronic device 104 of various embodiments may be used as a multi-bit memory device in which more programmed states are possible by the first ferroelectric layer FE1, the second ferroelectric layer FE2, and the third ferroelectric layer FE3. Such a memory device may be used for neuromorphic applications having analog characteristics; however, example embodiments are not limited thereto.

Figure 11:
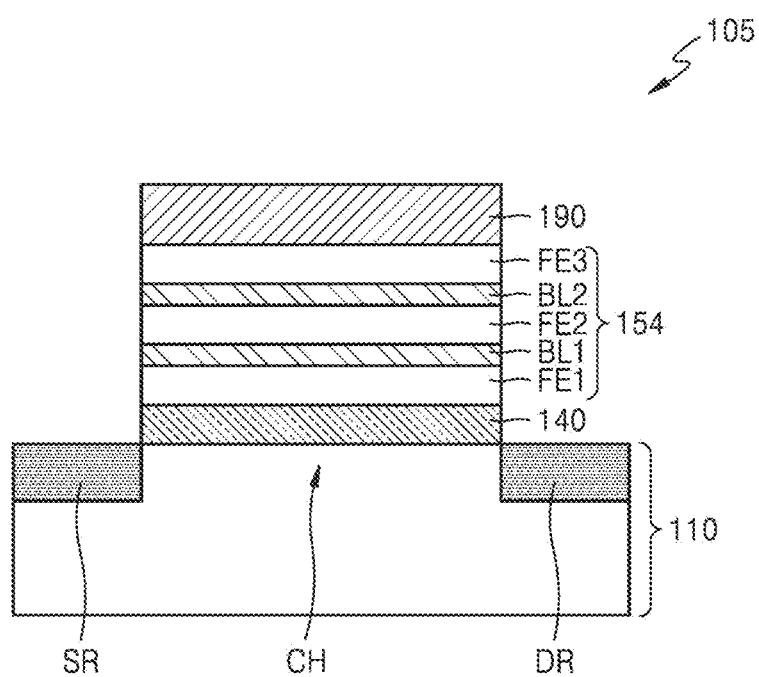
FIG. 11 is a cross-sectional view illustrating a schematic structure of an electronic device according to some example embodiments.

FIG. 11 is a cross-sectional view illustrating a schematic structure of an electronic device 105 according to various example embodiments.

The electronic device 105 of example embodiments illustrated in FIG. 11 may be substantially the same as the electronic device 104 shown in FIG. 10 except that a dielectric layer 140 is further provided between a ferroelectric thin film structure 154 and a channel CH. The dielectric layer 140 may include substantially the same material as the dielectric layer 140 described with reference to FIG. 9.

The above-described electronic devices 100, 101, 102, 103, 104, and 105 may be employed in various electronic apparatuses. The above-described electronic devices 100, 101, 102, 103, 104, and 105 may be used as logic transistors or memory transistors.

The above-described electronic devices 100, 101, 102, 103, 104, and 105 may be used as memory cells. For example, a memory cell array may be formed by: two-dimensionally arranging such memory cells; vertically and/or horizontally arranging such memory cells in one direction; and/or arranging such memory cells in one direction to form memory cell strings and two-dimensionally arranging such memory cell strings.

The above-described electronic devices 100, 101, 102, 103, 104, and 105 may form a part of an electronic circuit of an electronic apparatus, together with other circuit elements such as capacitors and/or resistors and/or other active or passive components such as other planar and/or vertical transistors; such transistors and/or other active or passive components may be arranged in standard cells, which may form part of an electronic circuit.

Figure 12:
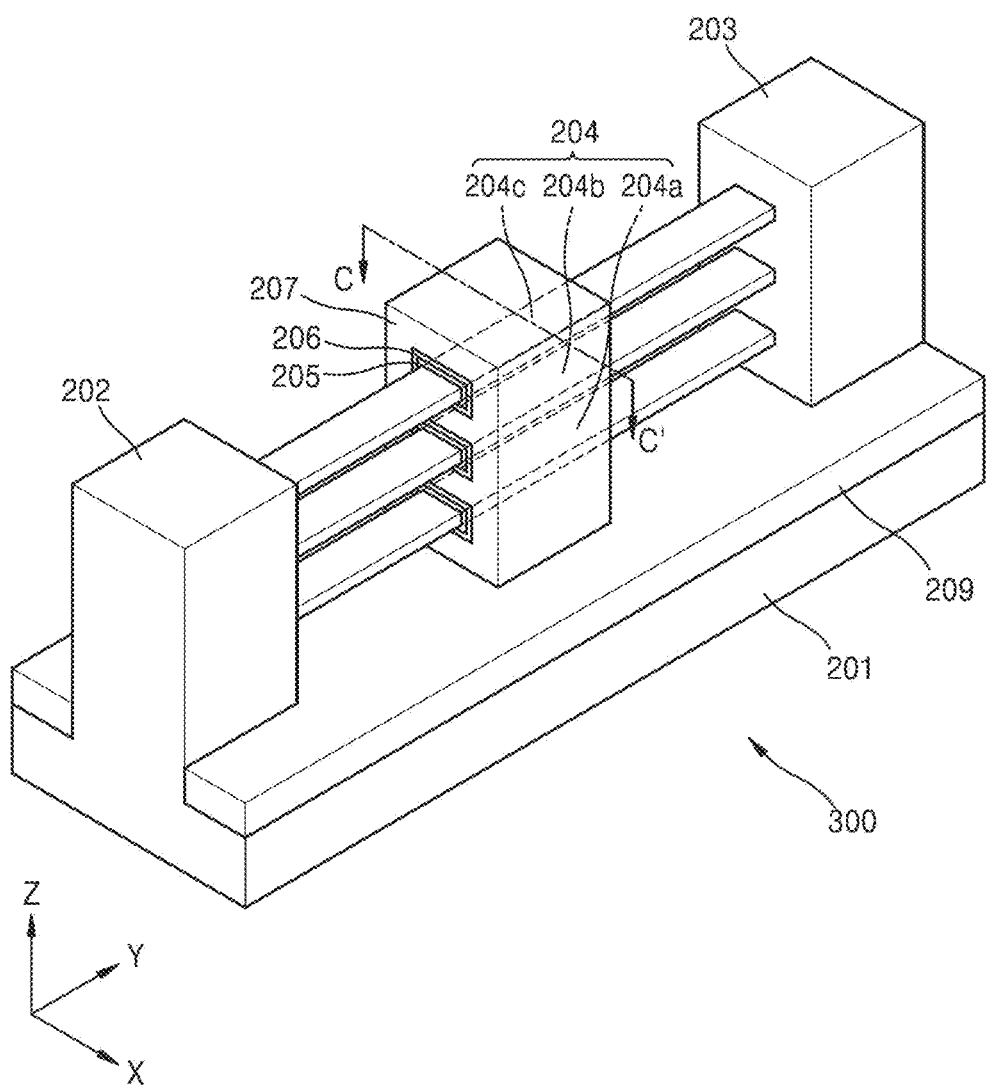
FIG. 12 is a schematic cross-sectional view illustrating a structure of an electronic device according to some example embodiments.

FIG. 12 is a schematic cross-sectional view illustrating a structure of an electronic device 300 according to some example embodiments. Referring to FIG. 12, the electronic device 300 includes a substrate 201, a first source/drain region 202 protruding in the Z-direction from an upper surface of the substrate 201, a second source/drain region 203 protruding in the Z-direction from the upper surface of the substrate 201, a channel 204 separated from the upper surface of the substrate 201 and having a bar shape extending in the Y-direction, an interfacial insulating layer 205 surrounding and covering the channel 204, a ferroelectric layer 206 surrounding and covering the interfacial insulating layer 205, and a gate electrode 207 surrounding and covering the ferroelectric layer 206. The ferroelectric layer 206 may be a ferroelectric thin film structure 150 or 154 which are included in the above described electronic device 100, 101, 102, 103, 104 or 015. The channel 204 may include a plurality of channel elements 204*a*, 204*b*, 204*c* disposed at a distance from each other in the Z-direction or an X direction that is different from the Y-direction. In FIG. 12, although the three channel elements 204*a*, 204*b*, and 204*c* are illustrated as being separated from each other in the Z-direction, this is merely an example and is not necessarily limited thereto. The electronic device 300 illustrated in FIG. 12 may be, for example, a GAAFET or an MBCFET™.

Figure 13:
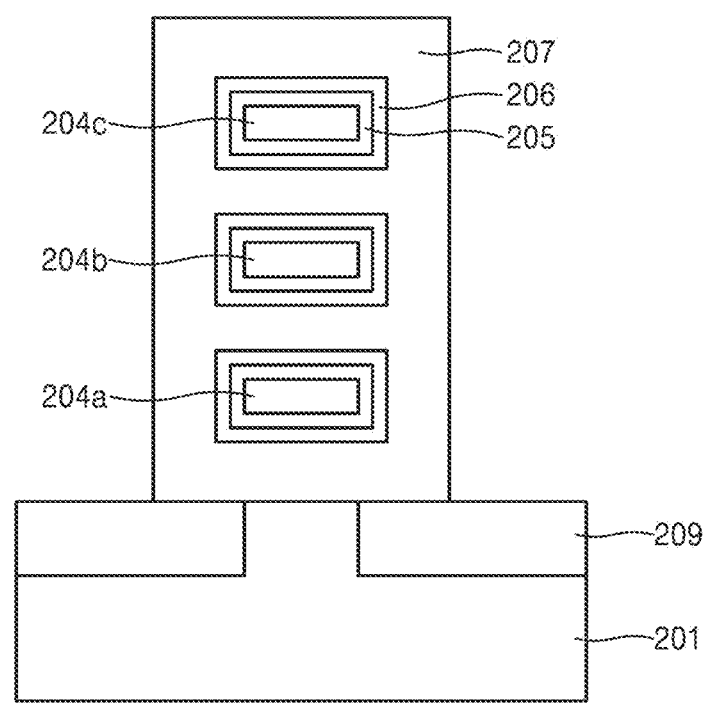
FIG. 13 is a schematic cross-sectional view showing a gate structure of the electronic device shown in FIG. 12.

FIG. 13 is a schematic cross-sectional view showing a gate structure of the electronic device 300 shown in FIG. 12, and in particular, a cross-sectional view taken along line C-C' of the gate structure. Referring to FIG. 13, the semiconductor device 300 may include a plurality of interfacial insulating layers 205 disposed to respectively surround four surfaces of the plurality of channel elements 204*a*, 204*b*, and 204*c*. Also, the electronic device 300 may include a plurality of ferroelectric layers 206 disposed to respectively surround four surfaces of the plurality of interfacial insulating layers 205. The gate electrode 207 may have a structure extending in the Z-direction by protruding from an upper surface of the substrate 201 to surround four surfaces of each of the plurality of ferroelectric layers 206.

Figure 14:
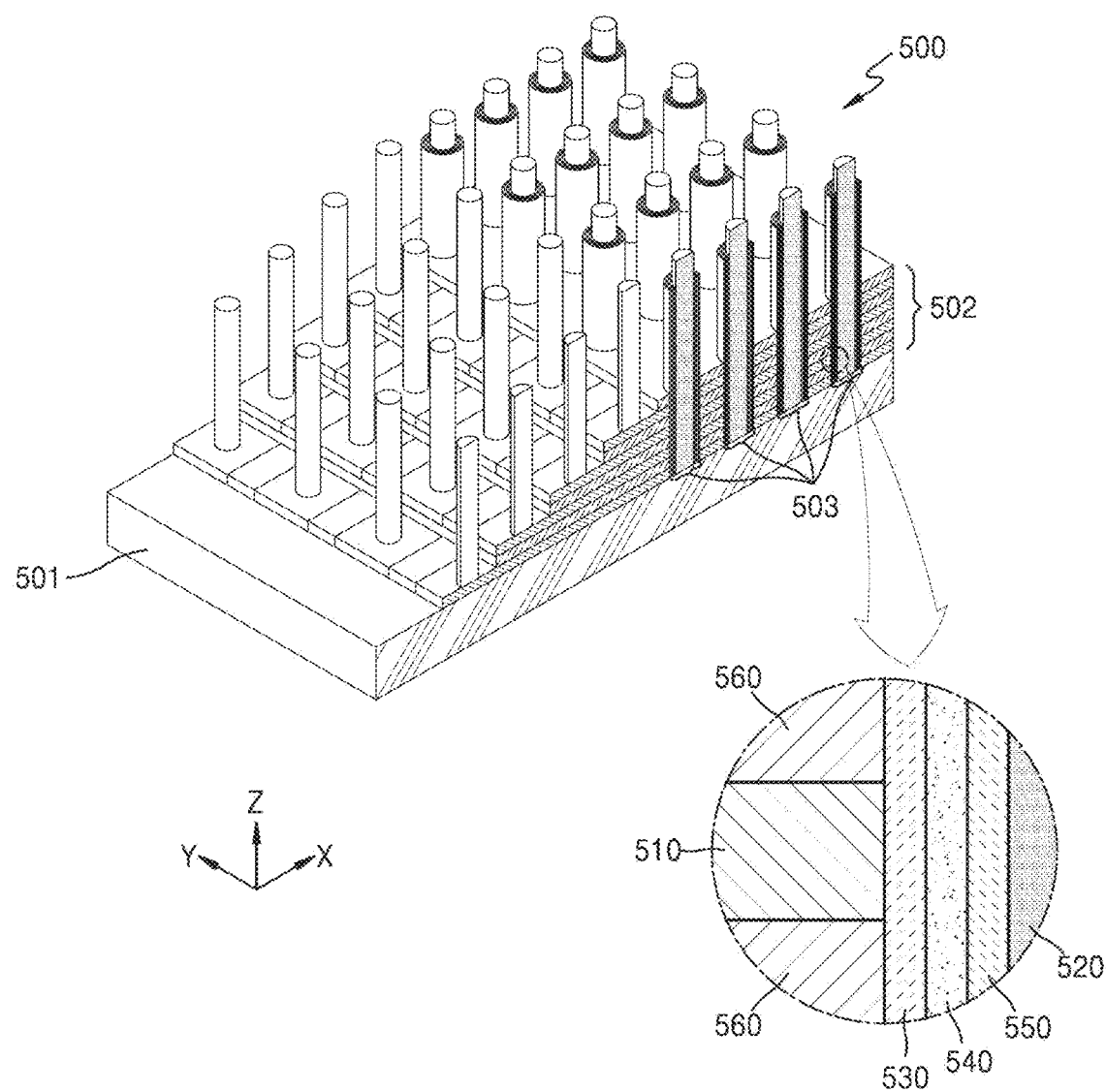
FIG. 14 is a schematic view of an electronic device according to some example embodiments.

FIG. 14 is a schematic view of an electronic device according to some example embodiments.

Referring to FIG. 14, an electronic device 500 may have a stack structure 502 in which a plurality of insulating layers 560 and a plurality of gate electrodes 510 are alternately and repeatedly stacked, and the ferroelectric layer 530, the interfacial layer 540, the channel 550, and the dielectric filler 520 may be arranged to penetrate the stack structure 502. The ferroelectric layer 530 may be a ferroelectric thin film structure 150 or 154 which are included in the above described electronic device 100, 101, 102, 103, 104 or 105. In detail, the insulating layers 560 and the gate electrodes 510 each may extend on the substrate 501 along an X-Y plane, and the insulating layers 560 and the gate electrodes 510 are alternately and repeatedly stacked in the Z direction (e.g., vertical direction), thereby forming the stack structure 502. Furthermore, the electronic device 500 may include a cell string 503 that includes the ferroelectric layer 530, the interfacial layer 540, the channel 550, and the dielectric filler 520, and the cell string 503 may be arranged to penetrate the stack structure 502 (e.g., in the Z direction, or vertical direction). In other words, the insulating layers 560 and the gate electrodes 510 may be arranged to surround the periphery of the cell string 503. In detail, the ferroelectric layer 530, the interfacial layer 540, the channel 550, and the dielectric filler 520 all may extend in the Z direction through the stack structure to intersect the insulating layers 560 and the gate electrodes 510. Furthermore, the dielectric filler 520 may be arranged in the center of the cell string 503, and the ferroelectric layer 530, the interfacial layer 540, and the channel 550 may be arranged to surround (e.g., concentrically surround as shown in FIG. 14) the dielectric filler 520. The interfacial layer 540 may be arranged between the ferroelectric layer 530 and the channel 550. The interfacial layer 540 may be an insulating layer. The electronic device 500 may include a plurality of cell strings as the cell string 503, and the cell strings 503 may be arranged spaced apart from each other (e.g., isolated from direct contact with each other) on the X-Y plane (e.g., plane of the stack structure) in a two dimension (e.g., along a plane of the stack structure as shown in FIG. 14, wherein the vertical direction or Z direction is perpendicular to the plane of the stack structure, or X-Y plane).

Figure 15:
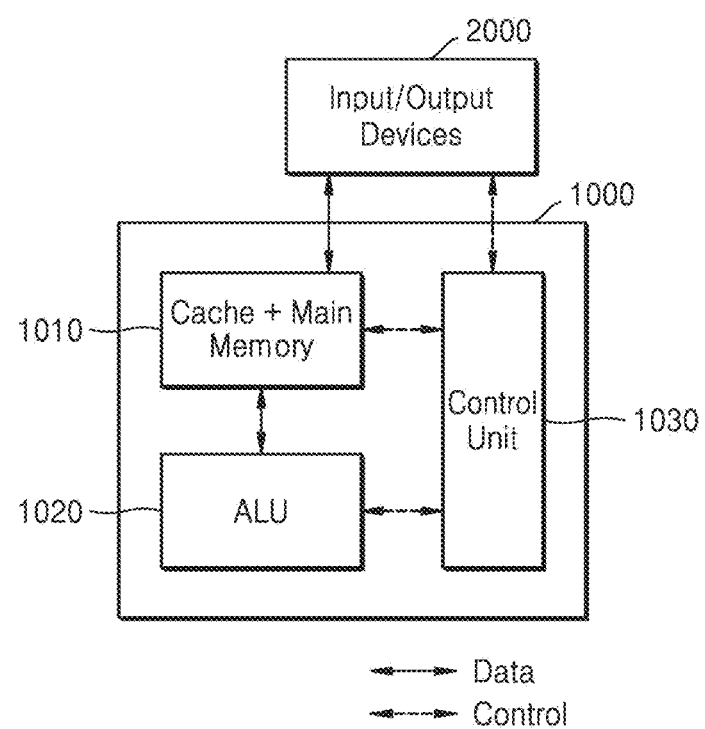
FIGS. 15 and 16 are conceptual views schematically illustrating device architectures applicable to electronic apparatuses according to some example embodiments.
Figure 16:
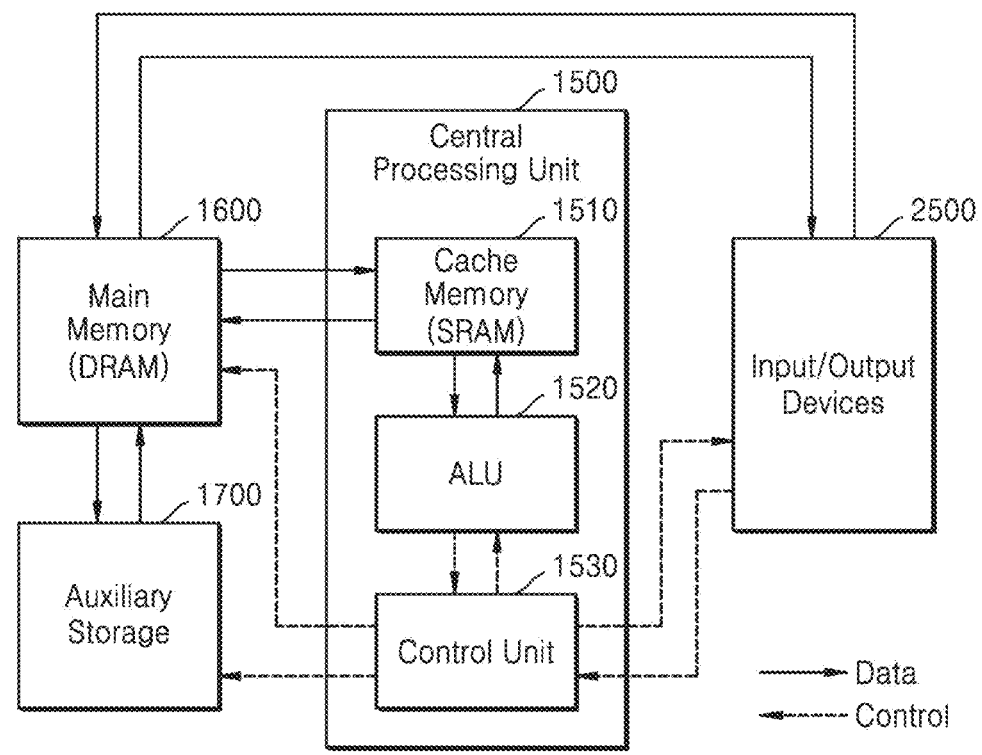

FIGS. 15 and 16 are conceptual views schematically illustrating device architectures applicable to electronic apparatuses according to various example embodiments.

Referring to FIG. 15, an electronic device architecture 1000 may include a memory device or memory unit 1010 and a control device or control unit 1030, and may further include an arithmetic logic unit (ALU) 1020. The memory unit 1010, the ALU 1020, and the control unit 1030 may be electrically connected to each other. For example, the electronic device architecture 1000 may be implemented as one chip including the memory unit 1010, the ALU 1020, and the control unit 1030. For example, the memory unit 1010, the ALU 1020, and the control unit 1030 may be interconnected through metal lines on a chip and may directly communicate with each other. The memory unit 1010, the ALU 1020, and the control unit 1030 may be monolithically integrated on a single substrate to form a single chip. An input/output device 2000 may be connected to the electronic device architecture (chip) 1000. In addition, the memory unit 1010 may include both a main memory and a cache memory. The electronic device architecture (chip) 1000 may be an on-chip memory processing unit.

The memory unit 1010, the ALU 1020, and/or the control unit 1030 may each independently include electronic devices having any of the above-described ferroelectric thin film structures. The electronic devices may be or may include logic transistors and/or memory transistors.

Referring to FIG. 16, a cache memory 1510, an ALU 1520, and a control unit 1530 may form a central processing unit (CPU) 1500, and the cache memory 1510 may be a static random access memory (SRAM). In addition to the CPU 1500, a main memory 1600 and an auxiliary storage 1700 may be provided, and an input/output device 2500 may also be provided. The main memory 1600 may be or may include a dynamic random access memory (DRAM); however, example embodiments are not limited thereto, and the main memory 1600 may be or may include another memory such as static random access memory (SRAM) and/or other memory.

In some cases, an electronic device architecture may be provided in a form in which computing unit devices and memory unit devices are adjacent to each other on a single chip without being grouped into sub-units.

As described above, according to various example embodiments, in the electronic devices having the ferroelectric thin film structures, the size of ferroelectric crystal grains is limited by the crystallization barrier layers, and thus dispersion of the performance of the electronic devices may not increase, or may increase by a smaller amount, even when the electronic devices have small sizes.

The electronic devices may improve memory performance uniformity and/or may have multi-bit memory performance.

FIG. 17 is a schematic view of a semiconductor apparatus (a structure in which a capacitor and a field-effect transistor are connected) according to some example embodiments. The capacitor may include one or more of the ferroelectric thin-film structure described above with reference to other example embodiments. The semiconductor apparatus of FIG. 17 may be or may include or correspond to a memory structure such as a one-transistor, one ferroelectric capacitor (1T1FC) memory structure.

Referring to FIG. 17, in a semiconductor apparatus D70, a capacitor D60 including ferroelectric thin film structure 150 is electrically connected to a field-effect transistor D61 through a contact 62. For example, one of electrodes 600 and 700 of the capacitor D60 and one of a first region and a second region 120 and 130 of the field effect transistor D61 are electrically connected by the contact 62. The contact 62 may include an appropriate conducting material such as at least one of tungsten, copper, aluminum, or polysilicon.

The field-effect transistor D61 may include a substrate 110 including a first region 120, a second region 130, and a third region 125; and a gate electrode 301 facing the third region 125. A dielectric layer 410 may further be included between the substrate 110 and the gate electrode 301.

Arrangement of the capacitor D60 and the field-effect transistor D61 may vary. For example, the capacitor D60 may be located on the substrate 110 or may be embedded in the substrate 110.

Although FIG. 17 illustrates that the ferroelectric thin film structure 150 corresponds to a dielectric of the capacitor D60, example embodiments are not limited thereto. For example, other embodiments of various other ferroelectric thin film structures may be used as or correspond to the dielectric of the capacitor D60.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

It should be understood that various example embodiments described herein should be considered in a descriptive sense only and not for purposes of limitation. Descriptions of features or aspects within each embodiment should typically be considered as available for other similar features or aspects in other embodiments. Example embodiments are not necessarily mutually exclusive with one another. For example, some embodiments may include features described with reference to one or more figures, and may also include features described with reference to one or more other figures. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
a substrate comprising a source, a drain, and a channel between the source and the drain;
a gate electrode above the substrate and facing the channel, the gate electrode apart from the channel in a first direction; and
a ferroelectric thin film structure between the channel and the gate electrode, the ferroelectric thin film structure comprising a first ferroelectric layer including an orthorhombic crystalline phase, a crystallization barrier layer comprising a dielectric material, and a second ferroelectric layer, wherein
the first ferroelectric layer, the crystallization barrier layer, and the second ferroelectric layer are sequentially on the channel in the first direction,
an average of sizes of crystal grains of the first ferroelectric layer is less than or equal to an average of sizes of crystal grains of the second ferroelectric layer, and
a size of each crystal grain refers to a maximum width of the each crystal grain in a cross-section perpendicular to the first direction.

2. The electronic device of claim 1,
wherein the average of the sizes of the crystal grains of the first ferroelectric layer is about 20 nm or less.

3. The electronic device of claim 1,
wherein the average of the sizes of the crystal grains of the first ferroelectric layer is about 10 nm or less.

4. The electronic device of claim 1,
wherein a thickness of the first ferroelectric layer ranges from about 0.5 nm to about 2 nm.

5. The electronic device of claim 1, wherein a thickness of the first ferroelectric layer is less than or equal to a thickness of the second ferroelectric layer.

6. The electronic device of claim 1,
wherein a thickness of the crystallization barrier layer is greater than 0 nm and less than or equal to about 2 nm.

7. The electronic device of claim 1,
wherein the crystallization barrier layer comprises at least one selected from a group including $AlO_x$ ($0<x<1$), $LaO_x$ ($0<x<1$), $YO_x$ ($0<x<1$), $LaAlO_x$ ($0<x<1$), $TaO_x$ ($0<x<1$), $TiO_x$ ($0<x<1$), $SrTiO_x$ ($0<x<1$), $MgO$, $ZrSiO$, a nitride, an oxynitride, graphene, boron nitride (BN), and a two-dimensional (2D) dielectric material.

8. The electronic device of claim 1, further comprising:
a dielectric layer between the channel and the first ferroelectric layer.

9. The electronic device of claim 8,
wherein the dielectric layer comprises a dielectric material having a bandgap greater than a bandgap of the first ferroelectric layer.

10. The electronic device of claim 1, wherein the ferroelectric thin film structure further comprises:
a second crystallization barrier layer on the second ferroelectric layer; and
a third ferroelectric layer on the second crystallization barrier layer.

11. The electronic device of claim 10,
wherein a thickness t1 of the first ferroelectric layer, a thickness t2 of the second ferroelectric layer, and a thickness t3 of the third ferroelectric layer satisfy $t1 \leq t2 \leq t3$.

12. The electronic device of claim 10,
wherein the average (a1) of the sizes of the crystal grains of the first ferroelectric layer, the average (a2) of the sizes of the crystal grains of the second ferroelectric layer, and an average (a3) of sizes of crystal grains of the third ferroelectric layer satisfy $a1 \leq a2 \leq a3$.

13. The electronic device of claim 10,
wherein a total thickness of the ferroelectric thin film structure ranges from about 4 nm to about 15 nm.

14. The electronic device of claim 1,
wherein the electronic device is configured to store a plurality of bits in one cell.

15. The electronic device of claim 1,
wherein a length of the channel in a direction from the source to the drain is about 1,000 nm or less.

16. The electronic device of claim 1,
wherein the channel comprises at least one selected from a group including Si, Ge, SiGe, Group III-V semiconductors, oxide semiconductors, nitride semiconductors, oxynitride semiconductors, 2D materials, quantum dots, transition metal dichalcogenides, and organic semiconductors.

17. The electronic device of claim 1,
wherein the first ferroelectric layer and the second ferroelectric layer each independently comprise an oxide of Si, Al, Hf, or Zr.

18. The electronic device of claim 17,
wherein the first ferroelectric layer and the second ferroelectric layer each independently comprise the oxide as a base material, and
the first ferroelectric layer and the second ferroelectric layer each independently further comprise at least one of C, Si, Ge, Sn, Pb, Al, Y, La, Gd, Mg, Ca, Sr, Ba, Ti, Zr, Hf, or N as a dopant material.

19. The electronic device of claim 18,
wherein the first ferroelectric layer and the second ferroelectric layer comprise same oxide as the base material, and
the first ferroelectric layer and the second ferroelectric layer further comprise different dopant materials.

20. An electronic apparatus comprising:
a memory device; and
a controller electrically connected to the memory device and configured to control the memory device,
wherein at least one of the memory device and the controller comprises the electronic device of claim 1.

* * * * *